US008971044B2

(12) United States Patent
Okumura et al.

(10) Patent No.: US 8,971,044 B2
(45) Date of Patent: Mar. 3, 2015

(54) SEMICONDUCTOR DEVICE

(75) Inventors: Keiji Okumura, Kyoto-fu (JP);
Takukazu Otsuka, Kyoto-fu (JP);
Masao Saito, Kyoto-fu (JP)

(73) Assignee: Rohm Co., Ltd., Kyoto (JP)

( * ) Notice: Subject to any disclaimer, the term of this patent is extended or adjusted under 35 U.S.C. 154(b) by 167 days.

(21) Appl. No.: 13/479,032

(22) Filed: May 23, 2012

(65) Prior Publication Data
US 2012/0229985 A1    Sep. 13, 2012

Related U.S. Application Data

(63) Continuation of application No. 12/954,451, filed on Nov. 24, 2010, now Pat. No. 8,208,260, which is a continuation of application No. 12/826,334, filed on Jun. 29, 2010, now Pat. No. 7,864,533, which is a continuation of application No. 12/234,761, filed on Sep. 22, 2008, now Pat. No. 7,773,381.

(30) Foreign Application Priority Data

Sep. 26, 2007   (JP) .................................. 2007-249498
Jan. 31, 2008   (JP) .................................. 2008-021859

(51) Int. Cl.
*H05K 7/20*    (2006.01)
*H01L 25/18*   (2006.01)
*H01L 25/16*   (2006.01)
(Continued)

(52) U.S. Cl.
CPC .............. *H01L 25/18* (2013.01); *H01L 25/162* (2013.01); *H01L 2224/48091* (2013.01); *H02M 7/003* (2013.01); *H05K 1/14* (2013.01); *H01L 2924/01019* (2013.01); *H01L 2224/45124* (2013.01); *H01L 2924/13055* (2013.01); *H01L 2924/30107* (2013.01)
USPC ........... 361/715; 361/115; 361/622; 361/690; 361/716; 361/709; 257/691; 257/692; 257/706; 257/685; 257/796; 363/65; 363/89

(58) Field of Classification Search
USPC .............................. 361/56, 65, 69, 115, 156, 361/679.46–679.54, 688–699, 702–717, 361/724–727; 257/686, 690–692, 678, 698, 257/355, 356, 603, 706–727; 165/80.2, 165/80.3, 80.4, 80.5, 104.33, 104.34, 185; 363/56, 69, 56.01, 56.02, 21.06, 21.14, 363/95–98, 81, 84, 89, 126, 127, 108, 144, 363/234, 377, 147, 15–17; 307/43, 52, 53, 307/60, 67, 59, 82; 29/890.032, 890.045, 29/895.212, 888.045, 890.03, 726, 726.5; 62/259.2
See application file for complete search history.

(56) References Cited

U.S. PATENT DOCUMENTS

| | | | | |
|---|---|---|---|---|
| 5,016,138 A | * | 5/1991 | Woodman | ...................... 361/688 |
| 5,295,044 A | * | 3/1994 | Araki et al. | .................... 361/709 |
| 5,365,424 A | | 11/1994 | Deam et al. | |

(Continued)

FOREIGN PATENT DOCUMENTS

JP    2005-142228    6/2005

*Primary Examiner* — Michail V Datskovskiy
(74) *Attorney, Agent, or Firm* — Fish & Richardson P.C.

(57) ABSTRACT

A semiconductor device includes: a first output unit configured to output a first phase; a second output unit configured to output a second phase different from the first phase, the second output unit being disposed to be stacked on the first output unit; and a controller configured to control the output units.

17 Claims, 16 Drawing Sheets

(51) Int. Cl.
*H02M 7/00* (2006.01)
*H05K 1/14* (2006.01)

(56) References Cited

U.S. PATENT DOCUMENTS

| | | | |
|---|---|---|---|
| 5,444,295 A | 8/1995 | Lake et al. | |
| 5,532,512 A | 7/1996 | Fillion et al. | |
| 5,537,074 A | 7/1996 | Iversen et al. | |
| 5,574,312 A | 11/1996 | Bayerer et al. | |
| 5,635,757 A | 6/1997 | Stockmeier et al. | |
| 5,768,117 A | 6/1998 | Takahashi et al. | |
| 5,956,231 A | 9/1999 | Yamada et al. | |
| 6,054,765 A | 4/2000 | Eytcheson et al. | |
| 6,057,612 A * | 5/2000 | Temple | 307/150 |
| 6,060,795 A * | 5/2000 | Azotea et al. | 307/150 |
| 6,072,240 A | 6/2000 | Kimura et al. | |
| 6,084,771 A | 7/2000 | Ranchy et al. | |
| 6,127,727 A | 10/2000 | Eytcheson | |
| 6,160,696 A | 12/2000 | Bailey et al. | |
| 6,236,566 B1 | 5/2001 | Regnier et al. | |
| 6,317,345 B1 | 11/2001 | Hayward et al. | |
| 6,337,803 B2 | 1/2002 | Kikuchi et al. | |
| 6,377,461 B1 * | 4/2002 | Ozmat et al. | 361/704 |
| 6,434,008 B1 | 8/2002 | Yamada et al. | |
| 6,448,645 B1 | 9/2002 | Kimura et al. | |
| 6,462,382 B2 | 10/2002 | Yoshida et al. | |
| 6,593,622 B2 | 7/2003 | Kinzer et al. | |
| 6,618,278 B2 | 9/2003 | Suzuki et al. | |
| 6,885,097 B2 | 4/2005 | Maeno et al. | |
| 6,987,670 B2 | 1/2006 | Ahmed et al. | |
| 6,987,679 B2 | 1/2006 | Gan et al. | |
| 6,995,409 B2 * | 2/2006 | Breit et al. | 257/177 |
| 7,042,086 B2 | 5/2006 | Shimoida et al. | |
| 7,098,632 B2 | 8/2006 | Chen et al. | |
| 7,145,254 B2 * | 12/2006 | Hirano et al. | 257/796 |
| 7,200,007 B2 | 4/2007 | Yasui et al. | |
| 7,212,407 B2 | 5/2007 | Beihoff et al. | |
| 7,227,259 B2 | 6/2007 | Heilbronner et al. | |
| 7,239,513 B2 | 7/2007 | Lin | |
| 7,327,024 B2 | 2/2008 | Stevanovic et al. | |
| 7,420,224 B2 * | 9/2008 | Milich et al. | 257/177 |
| 7,440,261 B2 | 10/2008 | Lin | |
| 7,456,492 B2 | 11/2008 | Mochida | |
| 7,508,668 B2 | 3/2009 | Harada et al. | |
| 7,602,158 B1 | 10/2009 | Iacob | |
| 7,633,758 B2 | 12/2009 | Oohama | |
| 7,706,163 B2 | 4/2010 | Tan et al. | |
| 7,728,415 B2 | 6/2010 | Hosseini et al. | |
| 7,755,339 B2 | 7/2010 | Kojima et al. | |
| 7,775,187 B2 | 8/2010 | Boucard et al. | |
| 8,264,073 B2 * | 9/2012 | Standing | 257/685 |
| 2001/0052641 A1 | 12/2001 | Kuo et al. | |
| 2002/0024129 A1 | 2/2002 | Hirahara et al. | |
| 2006/0164607 A1 | 7/2006 | Morejon et al. | |
| 2009/0091892 A1 | 4/2009 | Otsuka et al. | |

* cited by examiner

SEMICONDUCTOR DEVICE

CROSS REFERENCE TO RELATED APPLICATIONS AND INCORPORATION BY REFERENCE

This application is a continuation of U.S. application Ser. No. 12/954,451, filed on Nov. 24, 2010, which in turn is a continuation of U.S. application Ser. No. 12/826,334, filed on Jun. 29, 2010, now U.S. Pat. No. 7,864,533, which issued on Jan. 4, 2011, which in turn is a continuation of U.S. application Ser. No. 12/234,761, filed on Sep. 22, 2008, now U.S. Pat. No. 7,773,381, which issued on Aug. 10, 2010, which in turn is based upon and claims the benefit of priority from prior Japanese Patent Application P2007-249498 filed on Sep. 26, 2007 and prior Japanese Patent Application P2008-021859 filed on Jan. 31, 2008; the entire contents of which are incorporated by reference herein.

BACKGROUND OF THE INVENTION

1. Field of the Invention

The present invention relates to a semiconductor device that is an intelligent power module including a power device and a control circuit.

2. Description of the Related Art

There has heretofore been known an IPM that is a power module in which output units and a control circuit are integrally provided. Specifically, the output units include IGBTs or the like and can output a plurality of different phases. Moreover, the control circuit is for controlling gates and the like of the IGBTs.

Japanese Patent Application Publication No. 2005-142228 (hereinafter Patent Document 1) discloses an IPM in which power devices (output units) for respectively outputting a U-phase, a V-phase and a W-phase are arranged on one planar plate member.

However, the IPM disclosed in Patent Document 1 has a problem of an increased plane area since the power devices are provided on one planar plate member.

SUMMARY OF THE INVENTION

The present invention was made to solve the problem described above, and aims to provide a semiconductor device whose plane area can be reduced.

As one aspect of the present invention, a semiconductor device includes: a first output unit configured to output a first phase; a second output unit disposed to be stacked on the first output unit and configured to output a second phase different from the first phase; and a controller configured to control the output units.

As another aspect of the present invention, the output unit further includes a high voltage unit and a low voltage unit which is supplied with power having a voltage lower than that applied to the high voltage unit, and the high voltage unit and the low voltage unit are stacked.

As another aspect of the present invention, the high voltage unit and the low voltage unit include semiconductor elements, and the high voltage unit and the low voltage unit are stacked so that the semiconductor elements thereof face each other.

As another aspect of the present invention, the high voltage unit and the low voltage unit further include wirings and bus bars through which currents flow. Moreover, any of the wirings and bus bars of the high voltage unit and any of the wirings and bus bars of the low voltage unit, through which a current flows in a direction opposite to that of a current flowing through the any of the wirings and bus bars of the high voltage unit, are disposed to each other in parallel.

As another aspect of the present invention, the first and second output units are provided upright on the controller.

As another aspect of the present invention, the first and second output units further include control bus bars for connection to the controller, and the control bus bars are inserted into holes formed in the controller.

As another aspect of the present invention, each of the first and second output units further includes a radiator plate for conducting heat in a direction different from a direction in which the controller is disposed.

As another aspect of the present invention, the output units further include a plurality of semiconductor elements and a wiring board having the semiconductor elements provided thereon, and the plurality of semiconductor elements are disposed on both sides of the board.

As another aspect of the present invention, the semiconductor device further includes a voltage regulator configured to regulate a voltage supplied from outside. Each of the output units and the voltage regulator has a switching device that is switchable on and off. Among the output units and the voltage regulator, one having a highest frequency for switching on and off the switching device is disposed on an outer side in a stacking direction.

As another aspect of the present invention, the voltage regulator has a frequency higher than that of each of the output units.

As another aspect of the present invention, the voltage regulator is disposed on an upstream of all the output units in an air flow.

As another aspect of the present invention, the voltage regulator further includes a high voltage unit having a switching device and a low voltage unit having a switching device and receiving a voltage lower than that applied to the high voltage unit. Moreover, a frequency for switching on and off the switching device in the low voltage unit of the voltage regulator is higher than a frequency for switching on and off the switching device in the high voltage unit of the voltage regulator. Furthermore, the low voltage unit of the voltage regulator is disposed on an outer side in a stacking direction.

As another aspect of the present invention, the low voltage unit of the voltage regulator is disposed on an upstream of the high voltage unit of the voltage regulator in an air flow.

The semiconductor device of the present invention can reduce a plane area by stacking the output units configured to output different phases.

DETAILED DESCRIPTION OF THE INVENTION

First Embodiment

Figure 1:
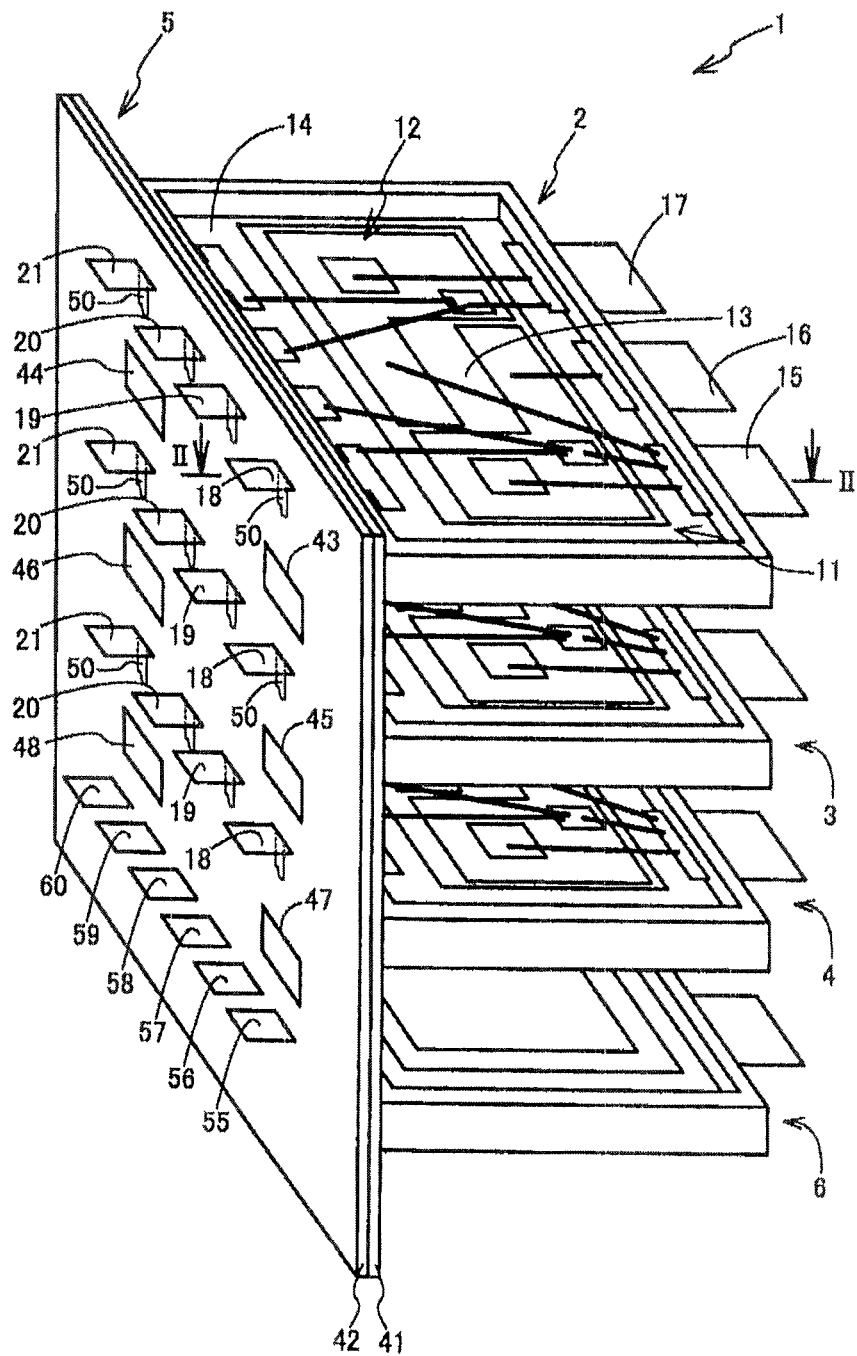
FIG. 1 is an overall perspective view of an IPM according to a first embodiment.
Figure 2:
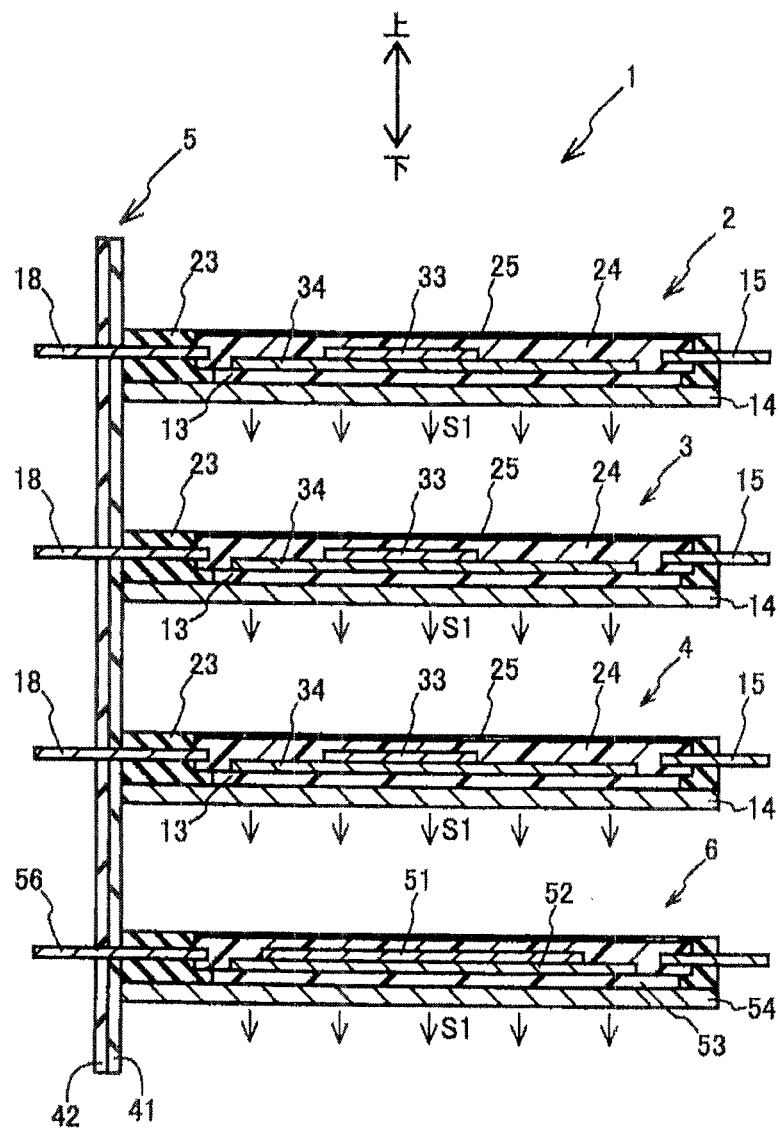
FIG. 2 is a cross-sectional view along the line II-II in FIG. 1.
Figure 3:
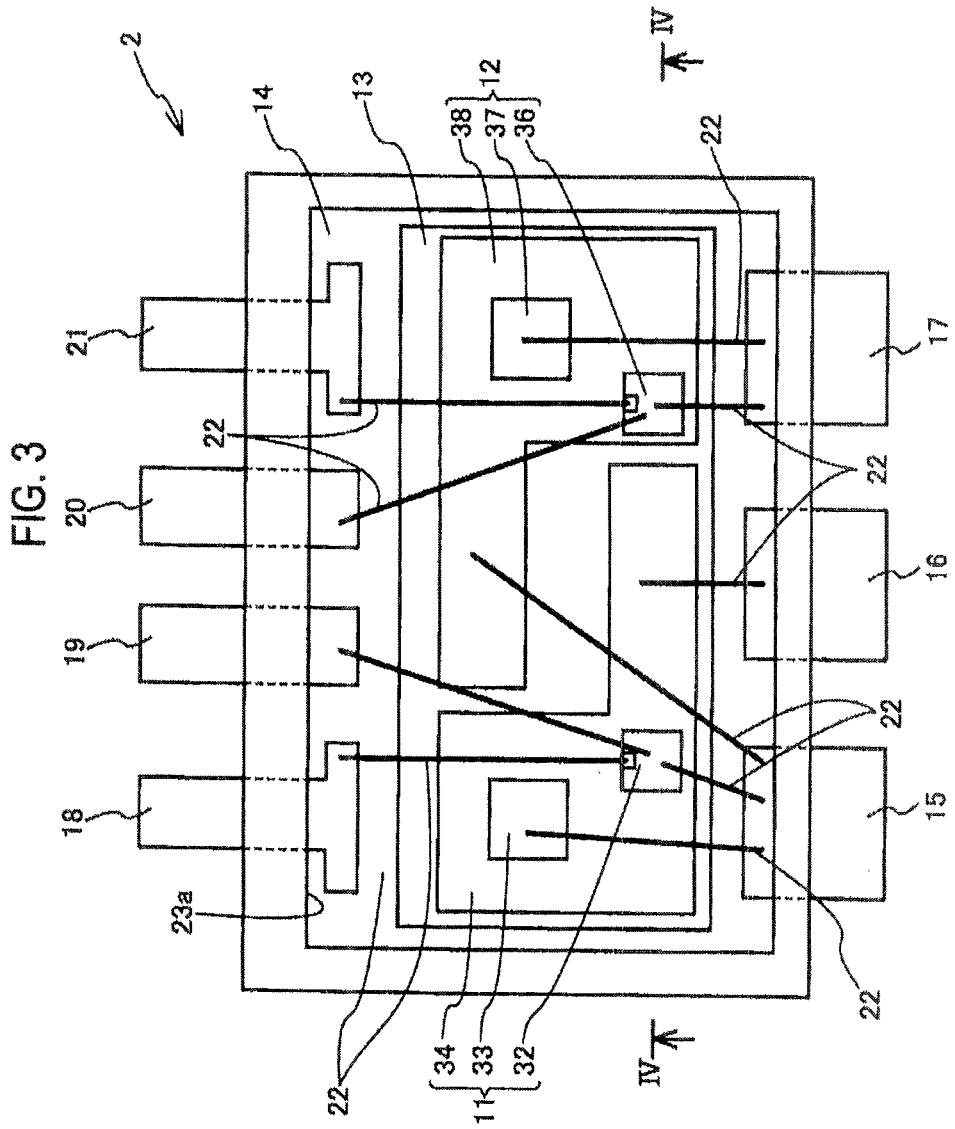
FIG. 3 is a plan view of a U-phase output unit.
Figure 4:
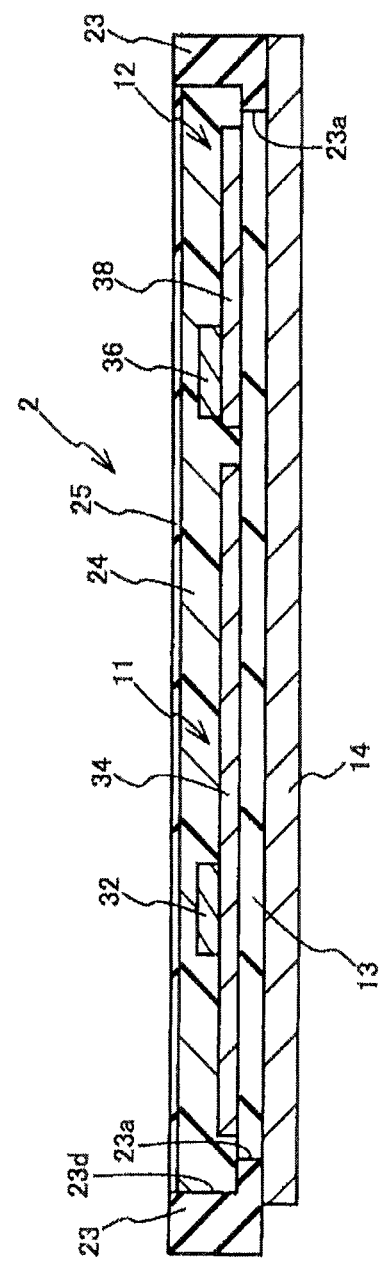
FIG. 4 is a cross-sectional view along the line IV-IV in FIG. 3.
Figure 5:
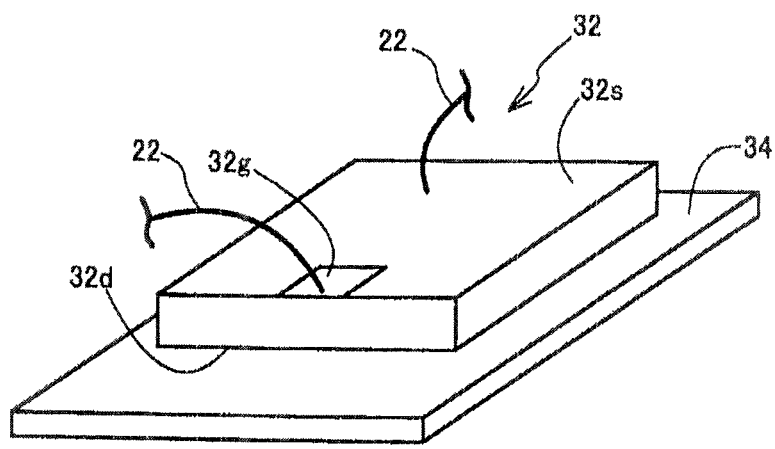
FIG. 5 is a perspective view showing a switching device.
Figure 6:
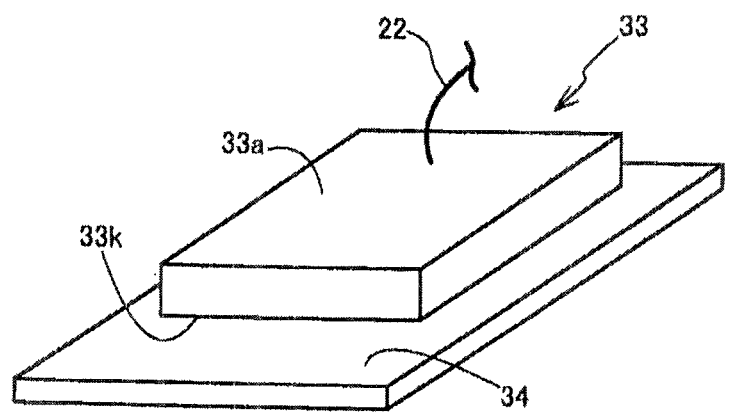
FIG. 6 is a perspective view showing a diode.
Figure 7:
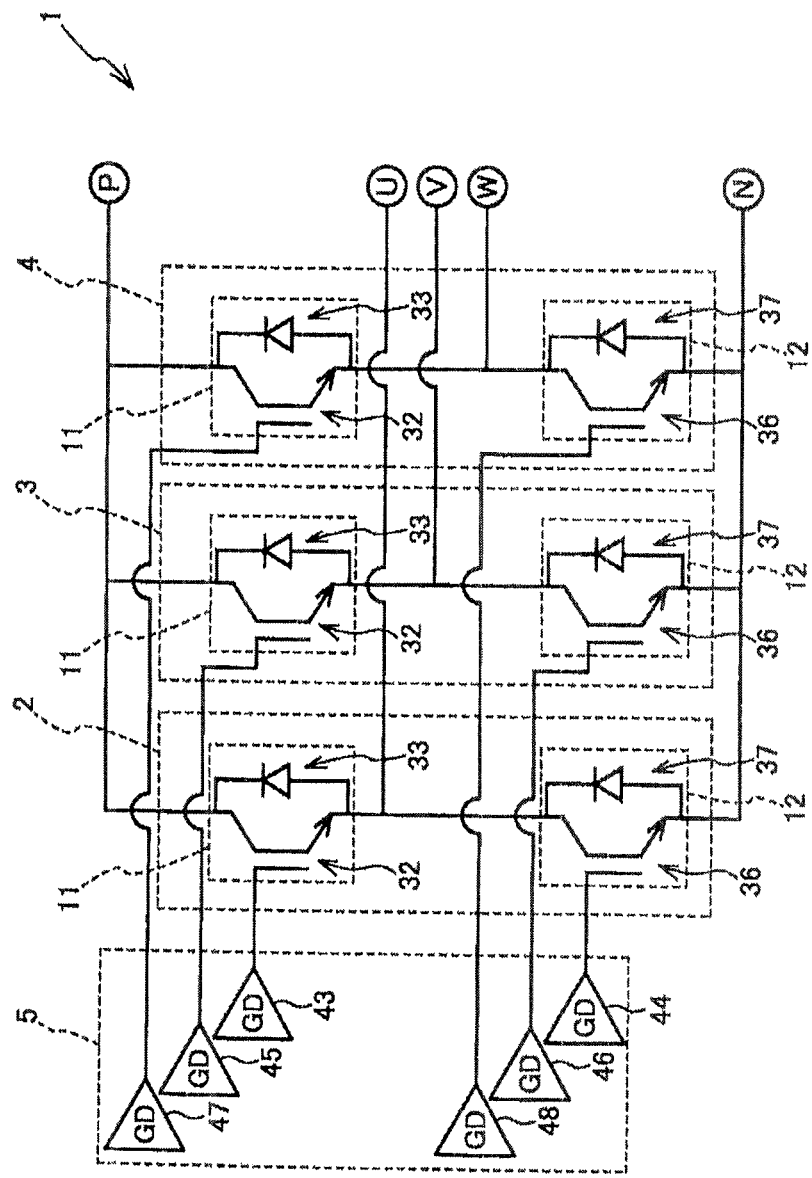
FIG. 7 is a schematic circuit diagram of the IPM.

With reference to the drawings, description will be given of a first embodiment in which the present invention is applied to a three-phase intelligent power module (hereinafter referred to as an IPM). FIG. 1 is an overall perspective view of an IPM according to a first embodiment. FIG. 2 is a cross-sectional view along the line II-II in FIG. 1. FIG. 3 is a plan view of a U-phase output unit. FIG. 4 is a cross-sectional view along the line IV-IV in FIG. 3. FIG. 5 is a perspective view showing a switching device. FIG. 6 is a perspective view showing a diode. FIG. 7 is a schematic circuit diagram of the IPM. Note that, in the following description, "top" and "bottom" shown in FIG. 2 represent a vertical direction.

As shown in FIGS. 1 and 2, an IPM 1 according to the first embodiment includes a U-phase output unit 2, a V-phase output unit 3, a W-phase output unit 4, a controller 5 and a booster 6. The output units 2 to 4 configured to output different phases and the booster 6 are stacked. Moreover, the output units 2 to 4 and the booster 6 are fixed with screws (not shown) so as to be spaced apart from each other in a state of standing vertically on the controller 5.

As shown in FIGS. 3 and 4, the U-phase output unit 2 includes a high voltage unit 11, a low voltage unit 12, a wiring board 13, a radiator plate 14, seven bus bars 15 to 21, a plurality of Al wires 22 and a case 23.

A direct-current power having a high voltage (positive voltage) is supplied to the high voltage unit 11 from a P-side power supply unit. The high voltage unit 11 includes: a switching device 32 formed of an npn-type insulated gate bipolar transistor (IGBT), a metal oxide semiconductor (MOS) transistor or the like; a commutating diode (hereinafter referred to as a diode) 33 for preventing a backflow; and an Al wiring 34 formed on the wiring board 13.

As shown in FIG. 5, a gate 32g and a source 32s are formed on an upper surface of the switching device 32. On a lower surface of the switching device 32, a drain 32d is formed, which is connected to the Al wiring 34 through solder. Note that, in the following description, a drain, a gate and a source of another switching device will also be described by attaching symbols d, g and s to the number of the switching device. As shown in FIGS. 3 and 7, the drain 32d of the switching device 32 is connected to the bus bar 16 for P side power supply through the Al wiring 34 and the Al wire 22. The source 32s of the switching device 32 is connected to the bus bar 15 for U-phase output through the Al wire 22. Moreover, the source 32s of the switching device 32 is also connected to the bus bar 19 for connection to the booster 6 through the Al wire 22. The gate 32g of the switching device 32 is connected to the bus bar 18 for connecting a gate driver through the Al wire 22.

Moreover, a material to form the switching device 32 is not particularly limited, and any of Si, SiC, GaN, AlN, diamond and the like can be used according to applications and purposes. For example, when switching loss or power loss is wished to be suppressed, SiC or GaN is preferable. Note that SiC is also effective in the case of an operation at a high temperature (about 300° C.). Moreover, GaN is preferable when the switching device is wished to be driven at a high frequency. Note that, when GaN is used, inductance components (L components) and capacity components (C components) can be further suppressed. Thus, miniaturization is also possible. Moreover, when a breakdown voltage is wished to be improved by increasing a breakdown coefficient, AlN is preferable. Note that, when AlN is used and the wiring board 13 is formed of the same AlN, generation of thermal stress attributable to a difference in a thermal expansion coefficient can be suppressed. Moreover, since diamond has a physical value greater than all the materials described above, use of the diamond leads to miniaturization of the IPM 1 and a significant reduction in the power loss or the switching loss.

The diode 33 is for preventing a current from flowing back to the switching device 32. As shown in FIG. 6, an anode 33a is formed on an upper surface of the diode 33. On a lower surface of the diode 33, a cathode 33k is formed, which is connected to the Al wiring 34 through solder. Note that, in the following description, an anode and a cathode of another diode will also be described by attaching symbols a and k to the number of the diode. As shown in FIGS. 3 and 7, the anode 33a of the diode 33 is connected to the bus bar 15 for U-phase output through the Al wire 22. The cathode 33k of the diode 33 is connected to the bus bar 16 for P side power supply through the Al wiring 34 and the Al wire 22. Specifically, the diode 33 is connected so as to allow a current to flow in a forward direction from the source 32s to the drain 32d of the switching device 32. Moreover, a material to form the diode 33 is not particularly limited, and any of Si, SiC, GaN, AlN, diamond and the like can be used according to applications and purposes as in the case of the switching device 32.

A direct-current power having a voltage (negative voltage) which is lower than the power supplied from the P side power supply unit is supplied to the low voltage unit 12 from an N side power supply unit. The low voltage unit 12 includes: a switching device 36 formed of an npn-type IGBT, a MOS (Metal Oxide Semiconductor) transistor or the like; a commutating diode (hereinafter referred to as a diode) 37 for preventing a backflow; and an Al wiring 38 formed on the wiring board 13.

A drain 36d of the switching device 36 is connected to the bus bar 15 for U-phase output through the Al wiring 38 and the Al wire 22. A source 36s of the switching device 36 is connected to the bus bar 17 for N side power supply through the Al wire 22. Moreover, the source 36s of the switching device 36 is also connected to the bus bar 20 for connection to the booster 6 through the Al wire 22. A gate 36g of the switching device 36 is connected to the bus bar 21 for connecting a gate driver.

An anode 37a of the diode 37 is connected to the bus bar 17 for N side power supply through the Al wire 22. A cathode 37k of the diode 37 is connected to the bus bar 15 for U-phase output through the Al wiring 38 and the Al wire 22.

The wiring board 13 is made of insulating $Al_2O_3$, AlN, $Si_3N_4$ or $SiO_2$. On an upper surface of the wiring board 13, the Al wirings 34 and 38 are formed (direct brazed aluminum: DBA). Instead of the Al wirings 34 and 38, a Cu wiring may be formed (direct bonding copper: DBC). Meanwhile, on a lower surface of the wiring board 13, the radiator plate 14 is bonded with a bonding agent (not shown) which is made of metal having good thermal conductivity (for example, Al, Cu or the like).

The radiator plate 14 is for releasing to the outside heat generated by the high voltage unit 11 and the low voltage unit 12, the heat being conducted through the wiring board 13. The radiator plate 14 is insulated from the high voltage unit 11 and the low voltage unit 12 by the insulating wiring board 13. As shown in FIG. 2, the radiator plate 14 is formed of a thermally conductive anisotropic material having a high thermal conductivity in a direction S1 perpendicular to the plane, in other words, the direction S1 different from a direction in which the controller 5 is arranged. As the thermally conductive anisotropic material, for example, one having aligned carbon fibers buried in aluminum or the like is applicable. A peripheral portion of the radiator plate 14 is bonded with an adhesive to a lower surface of the case 23.

The bus bars 15 to 21 are fixed by burying their center portions in the case 23. Thus, one ends of the bus bars 15 to 21 are arranged on a concave portion 23*d* side of the case 23 and the other ends thereof are arranged outside the case 23. The bus bars 15 to 21 are formed of conductive Cu or Al in the form of plates. The bus bar 15 is for outputting a U-phase. The bus bar 16 is for supplying P-side power. The bus bar 17 is for supplying N-side power. Specifically, a current in a direction opposite to that of a current flowing through the bus bar 17 flows through the bus bar 16. The bus bars 18 and 21 are connected to gate drives 43 and 44 to be described later in the controller 5. Moreover, the bus bars 19 and 20 are connected to the booster 6 through the gate drives 43 and 44.

The case 23 is made of synthetic resin and formed into a rectangular plate. In a center portion of the case 23, a window 23*a* is formed. The wiring board 13 is fitted into the window 23*a*. In the case 23, a concave portion 23*d* slightly larger than the window 23*a* is formed. The concave portion 23*d* is filled with protection gel 24 for protecting and insulating the high voltage unit 11, the low voltage unit 12 and the like. The protection gel 24 is made of soft silicon resin or epoxy resin that has a resistance to heat of about 180° C. Moreover, an upper surface of the protection gel 24 is covered with a cover 25 for preventing leak of the protection gel 24 and for suppressing heat conduction to the high voltage unit 11 and the low voltage unit 12.

Since the V-phase output unit 3 and the W-phase output unit 4 have approximately the same configuration as that of the U-phase output unit 2, only differences therebetween will be described. The V-phase output unit 3 outputs a V-phase from the bus bar 15 for output, the V-phase being different in phase from the U-phase. The W-phase output unit 4 outputs a W-phase from the bus bar 15 for output, the W-phase being different in phase from the U-phase and the V-phase. Bus bars 18 and 21 of the V-phase output unit 3 are connected to gate drives 45 and 46 in the controller 5. Moreover, bus bars 19 and 20 of the V-phase output unit 3 are connected to the booster 6 through the gate drives 45 and 46. Bus bars 18 and 21 of the W-phase output unit 4 are connected to gate drives 47 and 48 in the controller 5. Moreover, bus bars 19 and 20 of the W-phase output unit 4 are connected to the booster 6 through the gate drives 47 and 48.

The controller 5 includes a heat insulator 41, a wiring board 42, the six gate drives 43 to 48 and Al wirings 50. Note that only some of the Al wirings 50 are illustrated in the drawings. The heat insulator 41 is for suppressing conduction of heat from the phase output units 2 to 4 to the heat sensitive gate drives 43 to 48, respectively. The heat insulator 41 is made of insulating polyimide resin that has a resistance to heat of about 350° C., and is disposed between the wiring board 42 and the respective phase output units 2 to 4. In peripheral portions of the heat insulator 41 and the wiring board 42, holes 49 (see FIG. 10) for inserting therethrough the bus bars 15 to 21 for control and bus bars 55 to 60 are formed. The Al wirings 50 for respectively connecting the bus bars 18 to 21, the gate drives 43 to 48 and the bus bars 55 to 60 are extended from the respective holes 49. The bus bars 18 to 21 and the bus bars 55 to 60 are connected to the Al wirings 50 by use of solder.

The respective gate drives 43 to 48 are provided on the wiring board 42. The gate drive 43 (44) is for controlling the gate 32*g* (36*g*) of the switching device 32 (36) provided in the U-phase output unit 2. The gate drive 45 (46) is for controlling the gate 32*g* (36*g*) of the switching device 32 (36) provided in the V-phase output unit 3. The gate drive 47 (48) is for controlling the gate 32*g* (36*g*) of the switching device 32 (36) provided in the W-phase output unit 4.

As shown in FIG. 2, the booster 6 includes a booster circuit unit 51, an Al wiring 52, a wiring board 53, a radiator plate 54, the six bus bars 55 to 60 connected to the gate drives 43 to 48, and the case 23. The booster 6 controls voltages of the sources 32*s* and 36*s* of the switching devices 32 and 36 in the respective output units 2 to 4 connected through the gate drives 43 to 48, the bus bars 19 and 20 and the bus bars 55 to 60. Thus, voltages of the gates 32*g* and 36*g* of the switching devices 32 and 36 are stabilized to suppress application of a high voltage to the gates 32*g* and 36*g*.

Next, operations of the IPM 1 will be described.

When the power is supplied from the bus bar 16 for P-side power supply and the bus bar 17 for N-side power supply while controlling the gates 32*g* and 36*g* of the switching devices 32 and 36 by the gate drives 43 to 48, three-phase alternating-current power having different phases is outputted by the phase output units 2 to 4. Moreover, during the operation, heat is released in a direction S1 from the radiator plates 14 of the output units 2 to 4. Accordingly, the heat is released to the outside by the air passing through the spaces between the output units 2 to 4.

Figure 8:
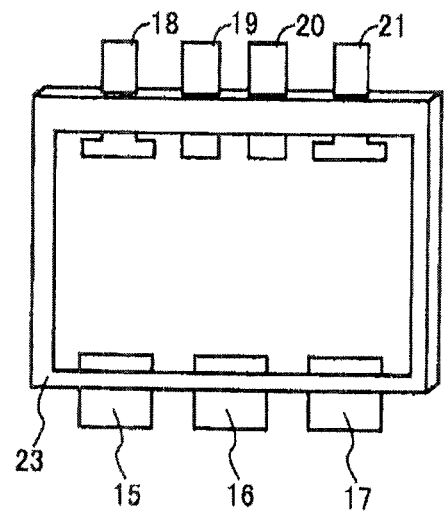
FIG. 8 is a perspective view showing a step of assembling the IPM.
Figure 9:
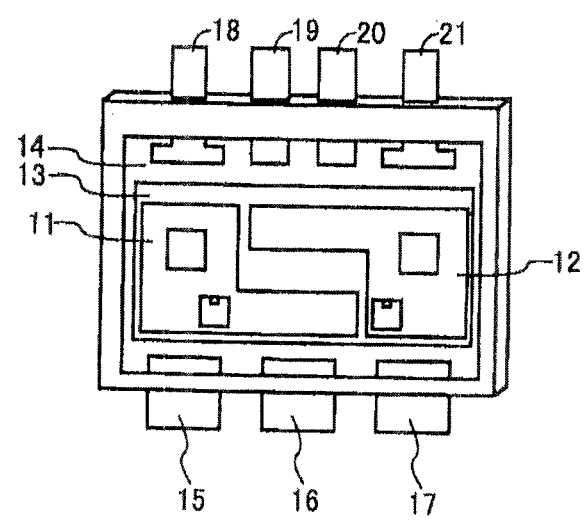
FIG. 9 is a perspective view showing a step of assembling the IPM.
Figure 10:
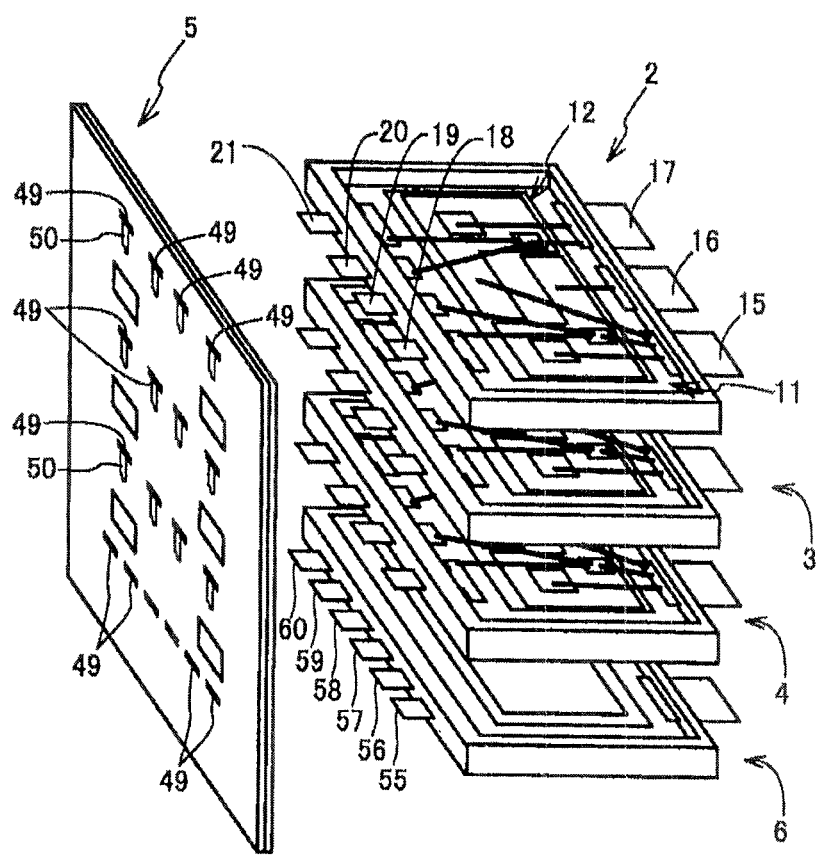
FIG. 10 is a perspective view showing a step of assembling the IPM.

Next, steps of assembling the IPM 1 will be described. FIGS. 8 to 10 are perspective views showing the steps of assembling the IPM.

First, as shown in FIG. 8, the case 23 is prepared by injection molding in a state where the bus bars 15 to 21 are placed in a mold. Next, as shown in FIG. 9, the radiator plate 14, on which the high voltage unit 11, the low voltage unit 12 and the wiring board 13 are bonded, is bonded to the case 23. Thereafter, as shown in FIG. 3, the Al wires 22 are laid out. Next, as shown in FIG. 10, positioning is performed so as to allow the bus bars 15 to 21 and the bus bars 55 to 60 to correspond to the holes 49 in the controller 5. Thereafter, the output units 2 to 4 and the booster 6 are inserted into the controller 5 and fixed with screws (not shown). Subsequently, the bus bars 15 to 21 and the bus bars 55 to 60 are electrically connected with solder to the Al wirings 50. Thus, the IPM 1 is completed.

As described above, in the IPM 1 according to the first embodiment, the output units 2 to 4 and the booster 6 are stacked. Thus, compared with the case where all the above components are disposed on the same plane, a plane area on a plan view can be reduced. Moreover, since the output units 2 to 4 and the booster 6 are stacked, an increase in the plane area can be suppressed even when a rectifier circuit and the like are newly provided.

Moreover, generally, in most cases, the gate drives are formed on the output units. Thus, heat from the output units are easily transmitted to the gate drives. However, in the IPM 1, the output units 2 to 4 are provided at right angles to the controller 5. Thus, heat transmission from the output units 2 to 4 to the controller 5 can be suppressed. Furthermore, heat transmission can be further suppressed by providing the heat insulator 41 between the gate drives 43 to 48 and the output units 2 to 4. Thus, even if the output units 2 to 4 are operated at a high temperature (for example, about 200° C.), breakage of the heat sensitive gate drives 43 to 48 can be suppressed. As a result, life of the IPM 1 can be extended.

Moreover, in the IPM 1, since the output units 2 to 4 and the booster 6 are stacked so as to have certain spaces therebetween, high air permeability is achieved. Accordingly, a cooling function can be improved. Thus, breakage of the heat sensitive gate drives 43 to 48 can be suppressed. Furthermore, by providing certain spaces between the output units 2 to 4 and the booster 6, heat transmission between the output units 2 to 4 can be suppressed. Thus, breakage of the switching devices 32 and 36 and the diodes 33 and 37 of the output units 2 to 4 can be suppressed. As a result, the life of the IPM 1 can be extended. Furthermore, in the IPM 1, since the output units 2 to 4 and the booster 6 are stacked, the switching devices 32 and 36 and the diodes 33 and 37 can be prevented from being adjacent to each other. Thus, concentration of heat can be suppressed.

Moreover, the bus bars 15 to 21 for control and the bus bars 55 to 60 are connected to the Al wirings 50 in a state where the bus bars are inserted into the holes 49 in the controller 5. Thus, positioning and connection can be easily performed.

Second Embodiment

Figure 11:
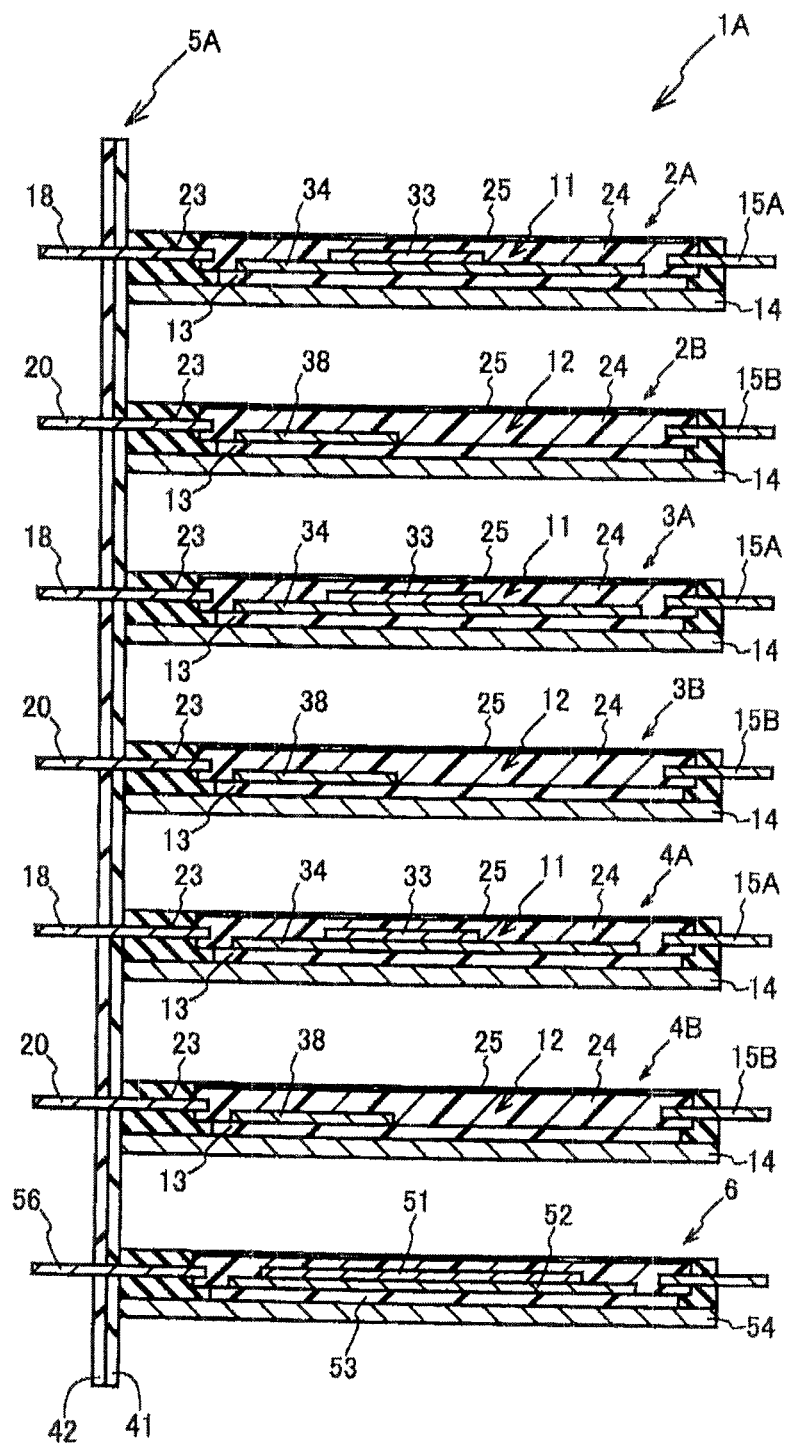
FIG. 11 is a cross-sectional view equivalent to FIG. 2, showing an IPM according to a second embodiment.
Figure 12:
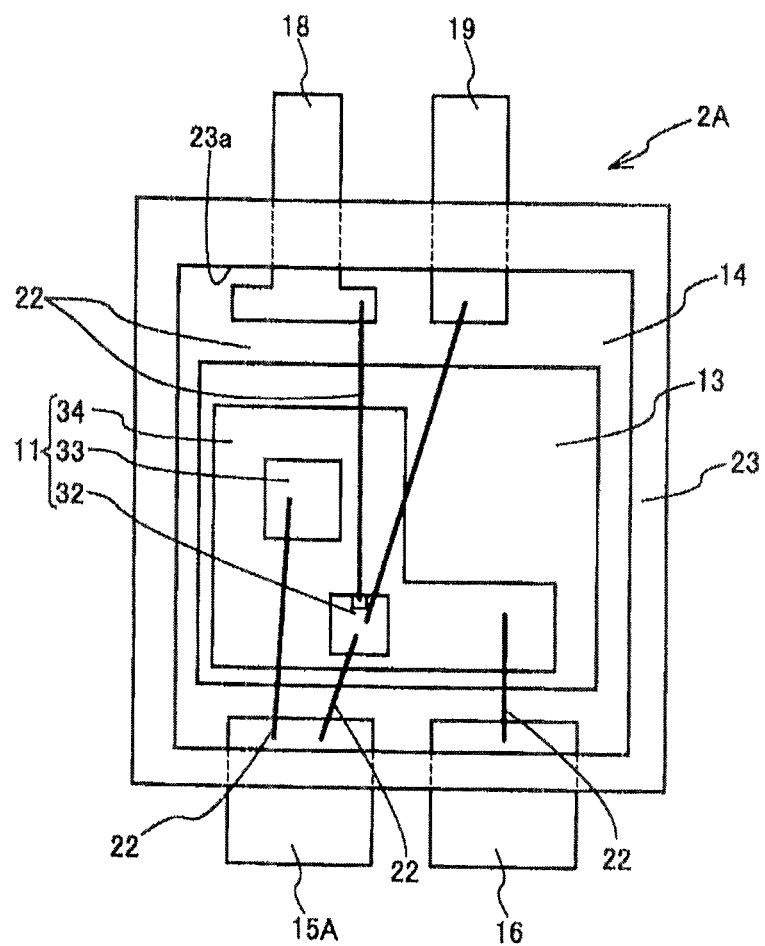
FIG. 12 is a plan view of an output unit on a high voltage unit side.
Figure 13:
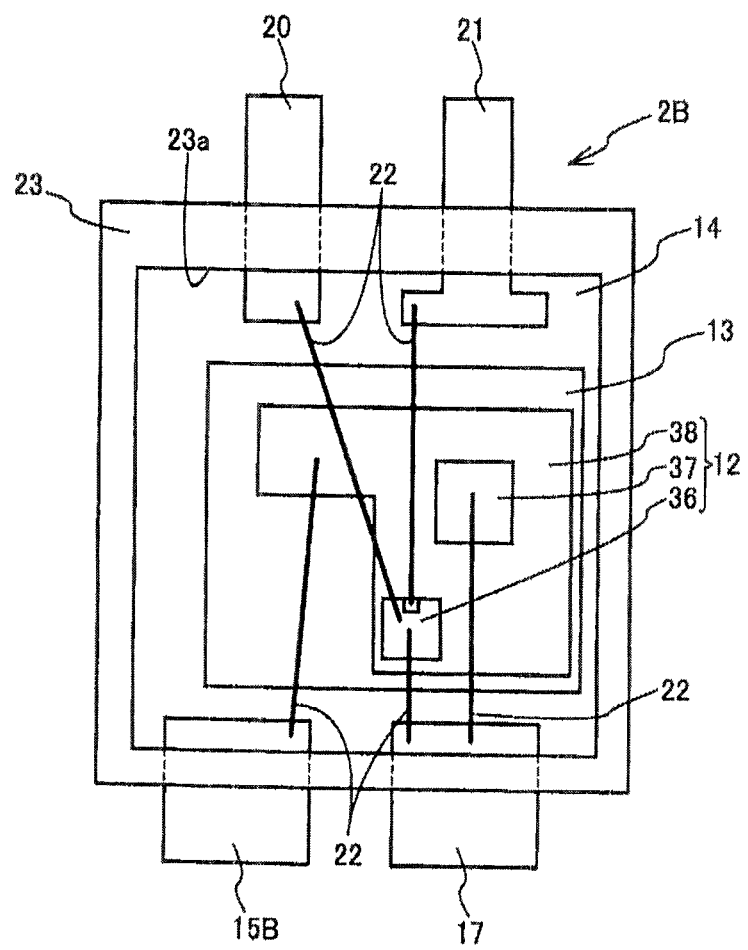
FIG. 13 is a plan view of an output unit on a low voltage unit side.

Next, description will be given of a second embodiment obtained by partially modifying the first embodiment described above. Note that the same constituent components as those of the first embodiment are denoted by the same reference numerals and description thereof will be omitted. FIG. 11 is a cross-sectional view equivalent to FIG. 2, showing an IPM according to the second embodiment. FIG. 12 is a plan view of an output unit on a high voltage unit side. FIG. 13 is a plan view of an output unit on a low voltage unit side.

As shown in FIG. 11, in an IPM 1A according to the second embodiment, output units 2A to 4A having high voltage units 11 and output units 2B to 4B having low voltage units 12 are formed of different components. Moreover, the output units 2A to 4A on the high voltage unit 11 side and the output units 2B to 4B on the low voltage unit 12 side are fixed to a controller 5A so as to be stacked on each other.

As shown in FIG. 12, the output unit 2A has approximately the same configuration as that of a half of the output unit 2 on the high voltage unit 11 side in the first embodiment. Moreover, as shown in FIG. 13, the output unit 2B has approximately the same configuration as that of a half of the output unit 2 on the low voltage unit 12 side in the first embodiment. As shown in FIGS. 12 and 13, the output units 2A and 2B include bus bars 15A and 15B for output, respectively. Moreover, the output units 2A and 2B are stacked so that bus bars 16 and 17, through which currents flow in opposite directions, is parallel to each other. Note that the output units 3A and 4A have the same configuration as that of the output unit 2A, and the output units 3B and 4B have the same configuration as that of the output unit 2B.

In the IPM 1A according to the second embodiment, the output units 2A to 4A on the high voltage unit 11 side and the output units 2B to 4B on the low voltage unit 12 side are separately configured and stacked. Thus, a plane area can be further reduced. Moreover, by disposing the bus bars 16 and 17 so that they are parallel to each other, parasitic inductances generated in the bus bars 16 and 17 can be cancelled. Note that, the IPM 1A is preferably configured so that any other pair of bus bars or Al wirings on the high and low voltage unit sides can be disposed to each other in parallel if the pair of bus bars or Al wirings let currents flow therethrough in opposite directions.

Third Embodiment

Figure 14:
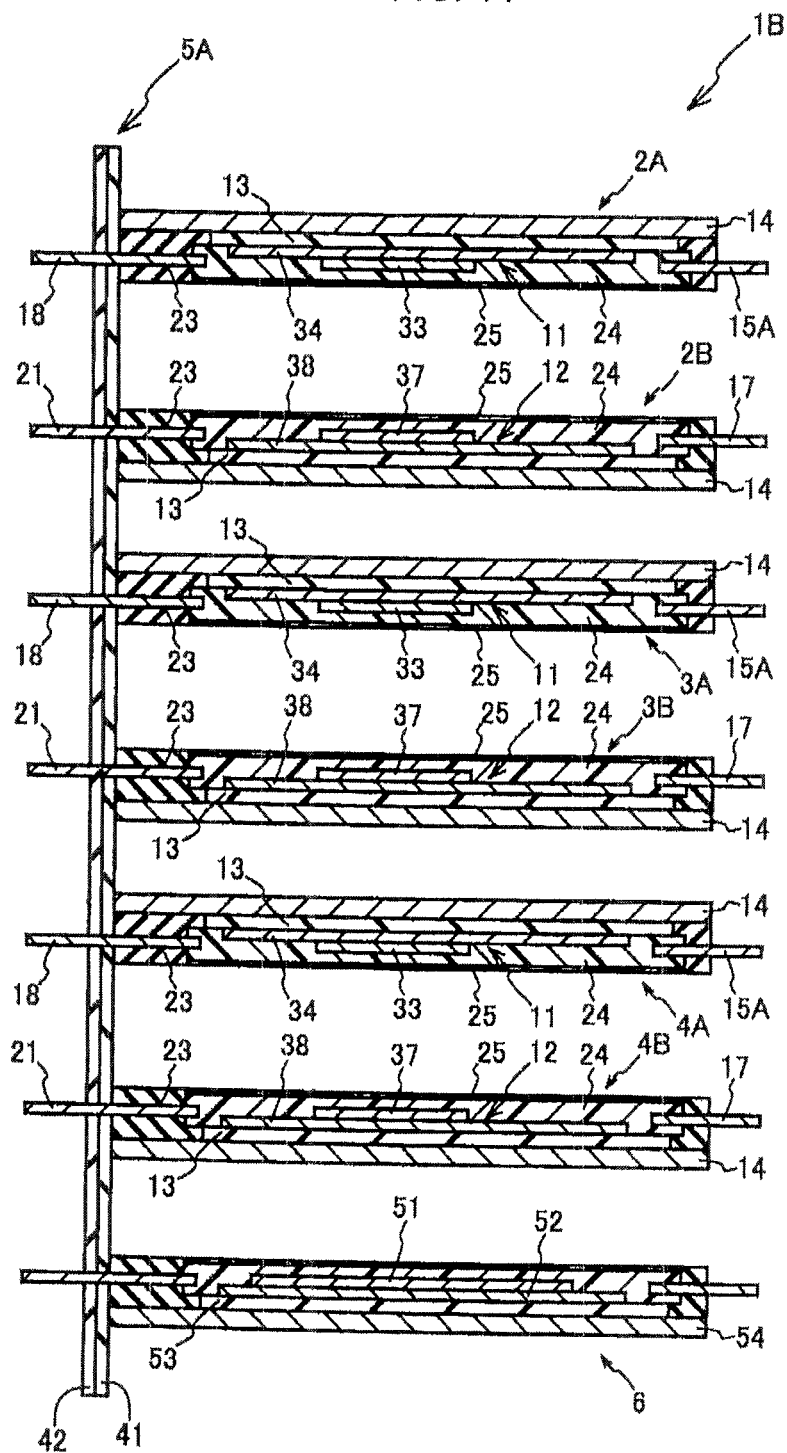
FIG. 14 is a cross-sectional view equivalent to FIG. 2, showing an IPM according to a third embodiment.

Next, description will be given of a third embodiment obtained by partially modifying the second embodiment described above. Note that the same constituent components as those of the first and second embodiments are denoted by the same reference numerals and description thereof will be omitted. FIG. 14 is a cross-sectional view equivalent to FIG. 2, showing an IPM according to the third embodiment.

As shown in FIG. 14, in an IPM 1B according to the third embodiment, the output units 2A to 4A on the high voltage unit 11 side in the IPM 1A in the second embodiment are turned upside down and mounted on the controller 5A. Specifically, the switching device 32 and the diode 33 in the high voltage unit 11 and the switching device 36 and the diode 37 in the low voltage unit 12 are arranged so as to face each other.

According to the configuration described above, parasitic inductances to be cancelled can be increased.

Fourth Embodiment

Figure 15:
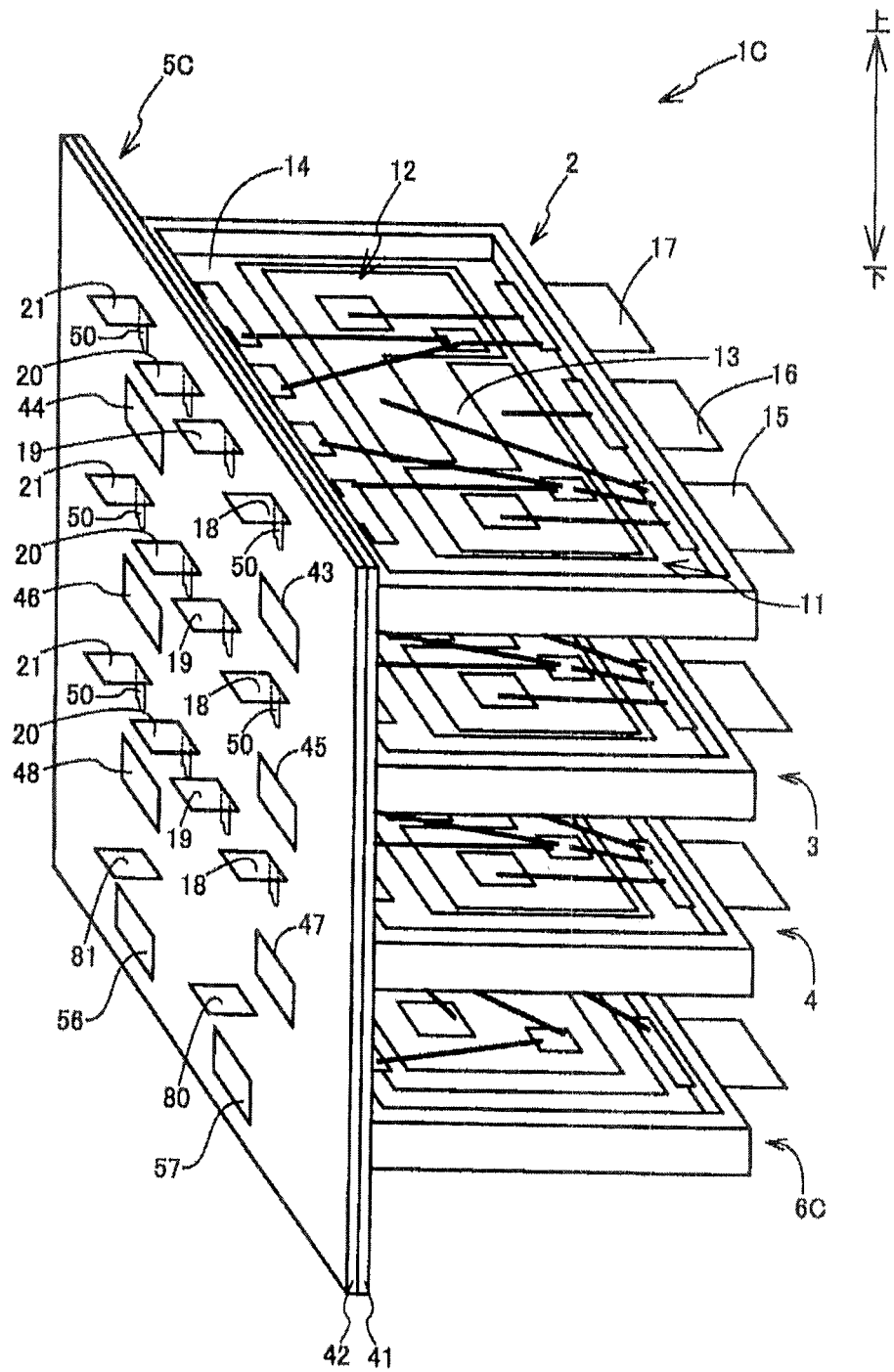
FIG. 15 is an overall perspective view of an IPM according to a fourth embodiment.
Figure 16:
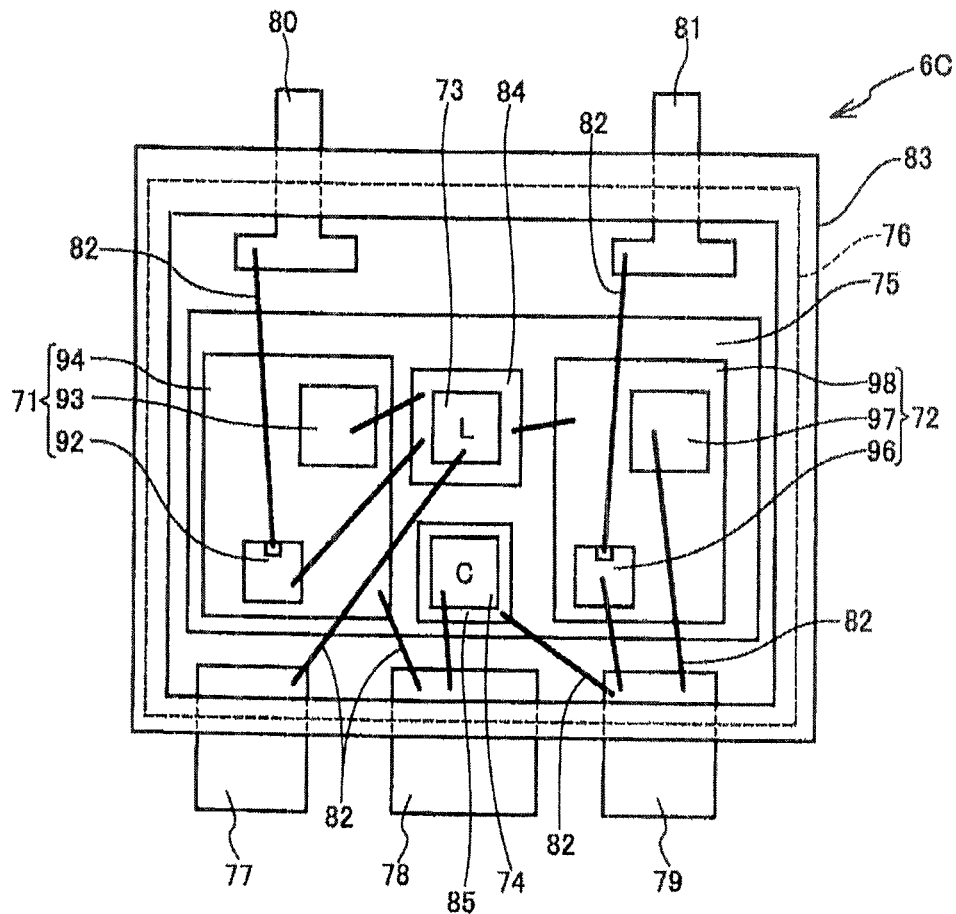
FIG. 16 is a plan view of a booster in the IPM according to the fourth embodiment.
Figure 17:
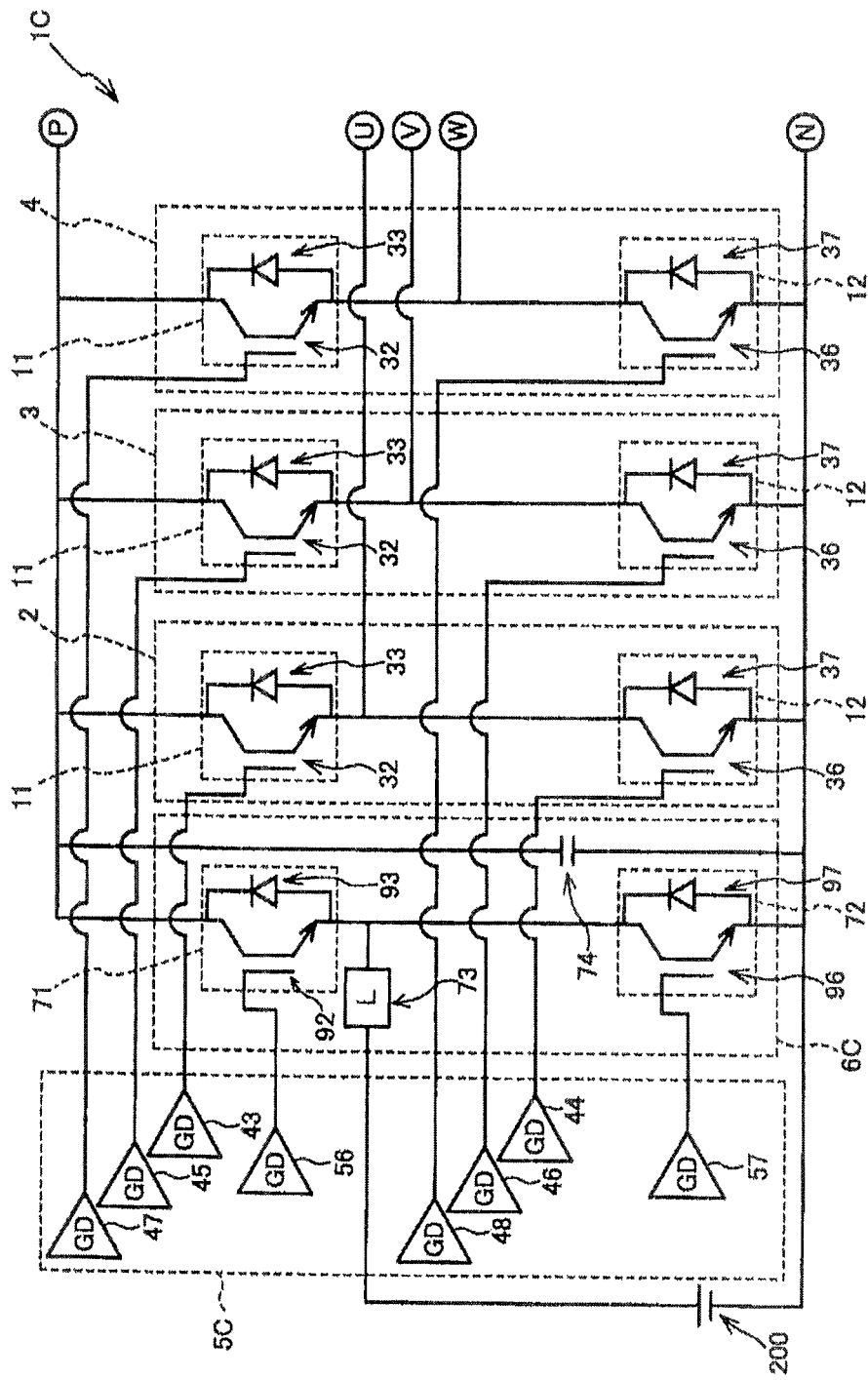
FIG. 17 is a schematic circuit diagram of the IPM according to the fourth embodiment.

Next, description will be given of a fourth embodiment obtained by partially modifying the first embodiment described above. Note that the same constituent components as those of the above embodiments are denoted by the same reference numerals and description thereof will be omitted. FIG. 15 is an overall perspective view of an IPM according to the fourth embodiment. FIG. 16 is a plan view of a booster in the IPM according to the fourth embodiment. FIG. 17 is a schematic circuit diagram of the IPM according to the fourth embodiment. Note that, in the following description, "top" and "bottom" shown in FIG. 15 represent a vertical direction. Moreover, the same constituent components as those of the above embodiments are denoted by the same reference numerals and description thereof will be omitted.

As shown in FIG. 15, an IPM 1C according to the fourth embodiment includes a U-phase output unit 2, a V-phase output unit 3, a W-phase output unit 4, a controller 5C and a booster (equivalent to a voltage regulator in claim 9) 6C. The output units 2 to 4 configured to output different phases and the booster 6C are stacked. Moreover, the output units 2 to 4 and the booster 6C are fixed with screws (not shown) so as to be spaced apart from each other in a state of standing vertically on the controller 5C.

The booster 6C increases a voltage of 200 V supplied from an external power source 200 to 600 V. Moreover, the booster 6C is for supplying boosted power to the output units 2 to 4 through respective bus bars 16 and 17. The booster 6C is disposed on a lowermost layer in a stacking direction (i.e., an outer layer in a stacking direction). Note that the voltage value described above can be changed as needed.

As shown in FIG. 16, the booster 6C includes a high voltage unit 71, a low voltage unit 72, a coil 73, a capacitor 74, a substrate 75, a radiator plate 76, four bus bars 77 to 81, a plurality of Al wires 82, a case 83 and Al wirings 84 and 85.

As shown in FIGS. 16 and 17, the high voltage unit 71 includes a switching device 92 formed of a transistor that can be switched on and off; a diode 93 for preventing a backflow; and an Al wiring 94. A source $92s$ of the switching device 92 is connected to the coil 73 through the Al wiring 84. A drain 92d of the switching device 92 is connected to the bus bar 78 for P-side power supply, to which one end of the capacitor 74 is connected, through the Al wiring 94. A gate 92g of the switching device 92 is connected to the gate driver 56 in the controller 5C through the bus bar 80. An anode 93a of the diode 93 is connected to one end of the coil 73 and the source 92s of the switching device 92 through the Al wiring 84. A cathode 93k of the diode 93 is connected to the bus bar 78, to which the one end of the capacitor 74 is connected, through the Al wiring 94.

The low voltage unit 72 includes: a switching device 96 formed of a transistor that can be switched on and off; a diode 97 for preventing a backflow; and an Al wiring 98. Note that a voltage lower than the voltage applied to the high voltage unit 71 is applied to the low voltage unit 72 by an external power source 200. A source 96s of the switching device 96 is connected to the bus bar 79 for N-side power supply, which is connected to a negative electrode of the power source 200 and one end of the capacitor 74. A drain 96d of the switching device 96 is connected to one end of the coil 73 through the Al wiring 98. A gate 96g of the switching device 96 is connected to the gate driver 57 in the controller 5C through the bus bar 81. An anode 97a of the diode 97 is connected to the bus bar 79 for N-side power supply. A cathode 97k of the diode 97 is connected to the one end of the coil 73 through the Al wiring 98.

The one end of the coil 73 is connected to the source 92s of the switching device 92, the anode 93a of the diode 93, the drain 96d of the switching device 96 and the cathode 97k of the diode 97 through the Al wiring 84. The other end of the coil 73 is connected to a positive electrode of the power source 200 through the bus bar 77.

The one end of the capacitor 74 is connected to the bus bar 78 for supplying P-side power to the output units 2 to 4. The other end of the capacitor 74 is connected to the bus bar 79 for supplying N-side power to the output units 2 to 4 through the Al wiring 85.

Next, operations of the booster 6C will be described.

When the switching device 96 in the low voltage unit 72 is on, currents flow through the coil 73 and the switching device 96. When the switching device 96 in the low voltage unit 72 is switched off from the above state, the flowing current is blocked and electromotive force is generated in the coil 73. When the switching device 92 in the high voltage unit 71 is switched off in the state where the electromotive force is generated in the coil 73, charges are supplied to the capacitor 74 from the coil 73 through the high voltage unit 71. Thus, the charges are accumulated in the capacitor 74 by the voltage of the power source 200 and the electromotive force in the coil 73. As a result, the voltage of the power source 200 is increased by the capacitor 74 and then applied to the output units 2 to 4.

Here, frequencies for switching on and off the switching devices 92 and 96 in the booster 6C are higher than those for switching on and off the switching devices 32 and 36 in each of the output units 2 to 4. Furthermore, a frequency for switching on and off the switching device 96 of the low voltage unit 72 in the booster 6C is higher than that for switching on and off the switching device 92 of the high voltage unit 71 in the booster 6C.

Specifically, a temperature of the booster 6C is higher than that of each of the output units 2 to 4. Furthermore, in the booster 6C, a temperature of the low voltage unit 72 is higher than that of the high voltage unit 71.

As described above, in the IPM 1C according to the fourth embodiment, the booster 6C, of which temperature rises above that of the output units 2 to 4, is disposed so as to be an outer layer in a stacking direction. Thus, heat release properties of the booster 6C can be improved. Furthermore, by setting the booster 6C as the lowermost layer, the booster 6C is positioned on an uppermost side of the flow of air. Thus, the heat from the output units 2 to 4 never acts on the booster 6C. Consequently, temperature rise of the booster 6C can be further suppressed.

Moreover, in order to suppress temperature rise of the booster, the booster has heretofore been provided for each output unit. However, in the IPM 1C, since the temperature rise of the booster 6C can be suppressed, the booster 6C can be shared by the output units 2 to 4. Thus, miniaturization of the IPM 1C can be further facilitated.

Fifth Embodiment

Figure 18:
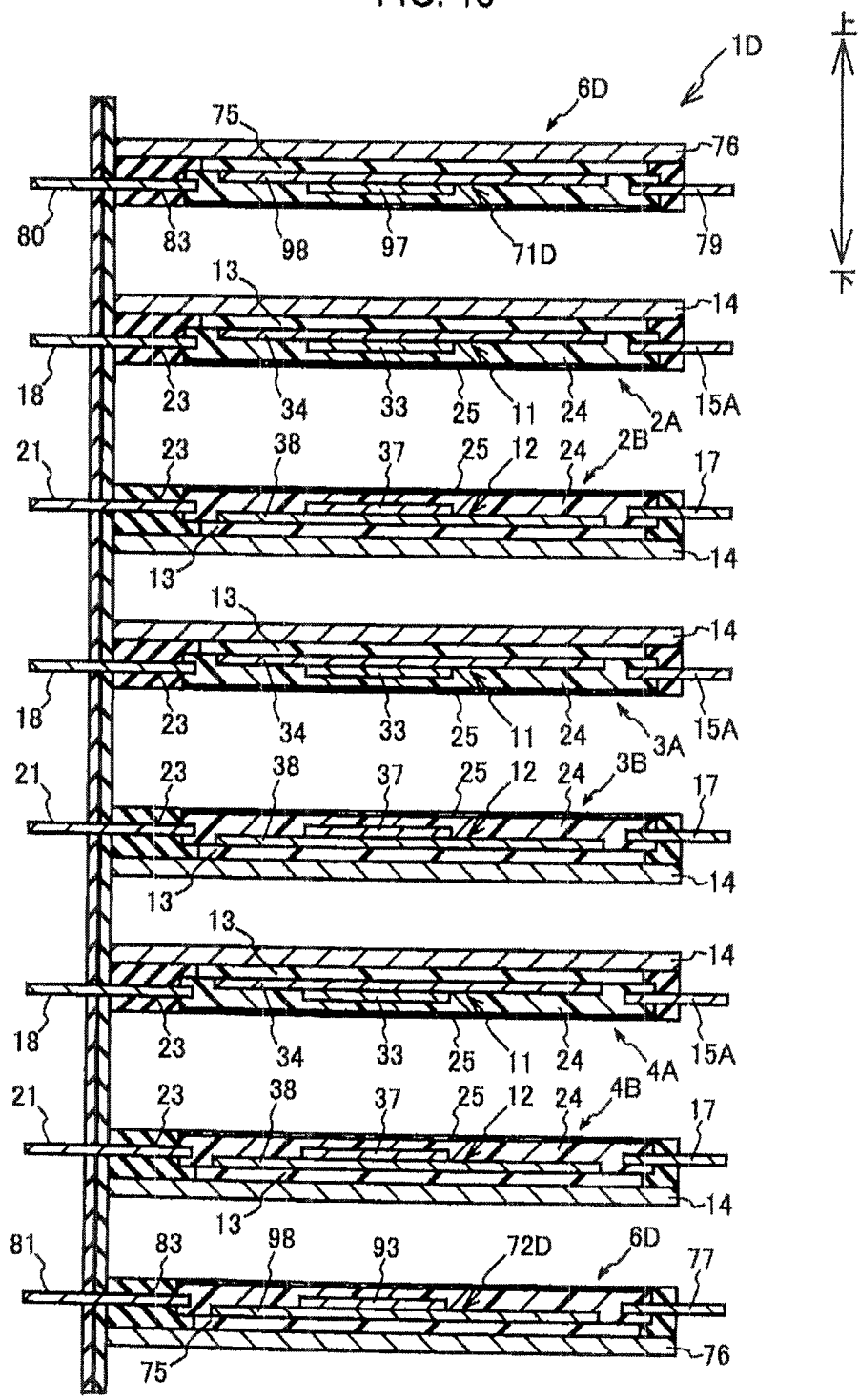
FIG. 18 is a cross-sectional view of an IPM according to a fifth embodiment.

Next, description will be given of a fifth embodiment obtained by partially modifying the third embodiment described above. Note that the same constituent components as those of the above embodiments are denoted by the same reference numerals and description thereof will be omitted. FIG. 18 is a cross-sectional view of an IPM according to the fifth embodiment.

As shown in FIG. 18, in an IPM 1D according to the fifth embodiment, output units 2A to 4A having high voltage units 11 and output units 2B to 4B having low voltage units 12 are formed of different components, as in the case of the third embodiment. Moreover, the output units 2A to 4A on the high voltage unit 11 side and the output units 2B to 4B on the low voltage unit 12 side are fixed to a controller 5A so as to be alternately stacked on each other.

Furthermore, in the IPM 1D according to the fifth embodiment, a booster 6D having a high voltage unit 71 and a booster 6E having a low voltage unit 72 are formed of different components. The booster 6E having the low voltage unit 72 is disposed on a lowermost layer in a stacking direction. Moreover, the booster 6D having the high voltage unit 71 is disposed on an uppermost layer in the stacking direction. The output units 2A to 4A and 2B to 4B are stacked between the booster 6E having the low voltage unit 72 and the booster 6D having the high voltage unit 71. Specifically, the boosters 6E and 6D undergoing temperature rise are disposed on the lowermost and uppermost layers, that is, on the outermost side in the stacking direction. Furthermore, given that the air flows from the high-temperature side to the low-temperature side, the booster 6E having the low voltage unit 72 is disposed on the uppermost side of the flow of air.

As described above, in the IPM 1D according to the fifth embodiment, the high voltage unit 71 in the booster 6D and the low voltage unit 72 in the booster 6E are disposed on the outermost layers in the stacking direction. Thus, heat release properties of the high voltage unit 71 in the booster 6D and the low voltage unit 72 in the booster 6E, both of which undergo temperature rise, can be improved. Furthermore, by disposing the low voltage unit 72 in the booster 6E on the uppermost side of the flow of air, temperature rise of the low voltage unit 72 in the booster 6E can be further suppressed.

Although the present invention has been described in detail by use of the embodiments, the present invention is not limited to the embodiments described in this specification. The scope of the present invention is determined by description of the scope of claims and scopes equivalent to the description of the scope of claims. Hereinafter, modified embodiments obtained by partially modifying the above embodiments will be described.

For example, in the above embodiments, the description was given of the example where the present invention is applied to the three-phase IPM. However, the present invention may be applied to IPMs with two, four or more phases.

Moreover, the materials, values, shapes and the like used in the above embodiments are illustrative only and can be changed accordingly.

Moreover, in the above embodiments, the switching devices as semiconductor elements and the diodes in the output units are disposed on the same plane of the wiring board. However, the switching devices and the diodes may be disposed on both sides, front and back surfaces, of the wiring board. Thus, the plane area can be further reduced.

Moreover, in the above embodiments, the description was given of the example where the output units are stacked with certain spaces therebetween. However, the spaces between the output units may be omitted. Note that, when such a configuration is used, holes for letting air pass therethrough are preferably provided in the case.

Moreover, in the above embodiments, one switching device is provided in each of the high voltage unit and the low voltage unit in each of the output units. However, a plurality of switching devices may be connected in parallel in each of the high voltage unit and the low voltage unit in each of the output units.

Moreover, in the above embodiments, the booster is described as an example of a voltage regulator. However, one capable of regulating a voltage is also applicable, such as a step-down unit for lowering a voltage supplied from the outside.

What is claimed is:

1. A semiconductor device comprising:
   a first output unit configured to output a first phase;
   a second output unit disposed to be stacked on the first output unit and configured to output a second phase different from the first phase; and
   a controller configured to control the output units, wherein the output units further include a plurality of semiconductor elements and a wiring board having the semiconductor elements provided thereon, and
   the plurality of semiconductor elements are disposed on both sides of the board.

2. The semiconductor device according to claim 1, wherein the output unit further includes a high voltage unit and a low voltage unit which is supplied with power having a voltage lower than that applied to the high voltage unit, and the high voltage unit and the low voltage unit are stacked.

3. The semiconductor device according to claim 2, wherein the high voltage unit and the low voltage unit include semiconductor elements, and the high voltage unit and the low voltage unit are stacked so that the semiconductor elements thereof face each other.

4. The semiconductor device according to claim 2, wherein the high voltage unit and the low voltage unit further include wirings and bus bars through which currents flow, any of the wirings and bus bars of the high voltage unit and any of the wirings and bus bars of the low voltage unit, through which a current flows in a direction opposite to that of a current flowing through the any of the wirings and bus bars of the high voltage unit, are disposed to each other in parallel.

5. The semiconductor device according to claim 1, wherein the first and second output units are provided upright on the controller.

6. The semiconductor device according to claim 5, wherein the first and second output units further include control bus bars for connection to the controller, and the control bus bars are inserted into holes formed in the controller.

7. The semiconductor device according to claim 1, wherein each of the first and second output units further includes a radiator plate for conducting heat in a direction different from a direction in which the controller is disposed.

8. The semiconductor device according to claim 1, further comprising: a voltage regulator configured to regulate a voltage supplied from outside, wherein each of the output units and the voltage regulator has a switching device that is switchable on and off, and among the output units and the voltage regulator, one having a highest frequency for switching on and off the switching device is disposed on an outer side in a stacking direction.

9. The semiconductor device according to claim 8, wherein the voltage regulator has a frequency higher than that of each of the output units.

10. The semiconductor device according to claim 9, wherein the voltage regulator is disposed upstream of all the output units in an air flow.

11. The semiconductor device according to claim 8, wherein the voltage regulator further includes a high voltage unit having a switching device and a low voltage unit having a switching device and receiving a voltage lower than that applied to the high voltage unit, a frequency for switching on and off the switching device in the low voltage unit of the voltage regulator is higher than a frequency for switching on and off the switching device in the high voltage unit of the voltage regulator, and the low voltage unit of the voltage regulator is disposed on an outer side in a stacking direction.

12. The semiconductor device according to claim 11, wherein the low voltage unit of the voltage regulator is disposed upstream of the high voltage unit of the voltage regulator in an air flow.

13. A semiconductor device comprising:
    a first output unit configured to output a first phase;
    a second output unit disposed to be stacked on the first output unit and configured to output a second phase different from the first phase; and
    a controller configured to control the output units; and
    a voltage regulator configured to regulate a voltage supplied from outside,
    wherein
    each of the output units and the voltage regulator has a switching device that is switchable on and off, and
    among the output units and the voltage regulator, one having a highest frequency for switching on and off the switching device is disposed on an outer side in a stacking direction.

14. The semiconductor device according to claim 13, wherein the voltage regulator has a frequency higher than that of each of the output units.

15. The semiconductor device according to claim 14, wherein the voltage regulator is disposed upstream of all the output units in an air flow.

16. The semiconductor device according to claim 13, wherein
    the voltage regulator further includes a high voltage unit having a switching device and a low voltage unit having a switching device and receiving a voltage lower than that applied to the high voltage unit,
    a frequency for switching on and off the switching device in the low voltage unit of the voltage regulator is higher than a frequency for switching on and off the switching device in the high voltage unit of the voltage regulator, and
    the low voltage unit of the voltage regulator is disposed on an outer side in a stacking direction.

17. The semiconductor device according to claim 16, wherein the low voltage unit of the voltage regulator is disposed upstream of the high voltage unit of the voltage regulator in an air flow.

* * * * *